United States Patent
Pietsch

(10) Patent No.: US 6,348,801 B1
(45) Date of Patent: Feb. 19, 2002

(54) FAULT ISOLATION OF AN ANTENNA PATH FOR A RADIO TELEPHONE

(75) Inventor: Andreas Pietsch, Dulmen (DE)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/533,689

(22) Filed: Mar. 23, 2000

(30) Foreign Application Priority Data

Mar. 26, 1999 (DE) .......................................... 199 13 954

(51) Int. Cl.[7] .......................... G01R 31/11; G01R 27/04; G01R 31/28; G01R 31/00
(52) U.S. Cl. ...................... 324/534; 324/642; 324/644; 324/647; 324/520; 324/527; 702/59
(58) Field of Search ................................ 324/534, 642, 324/644, 647, 520, 527; 702/59

(56) References Cited

U.S. PATENT DOCUMENTS

| | | | |
|---|---|---|---|
| 4,313,169 A | * 1/1982 | Takagi et al. .................. | 702/59 |
| 4,438,389 A | * 3/1984 | De Sa .......................... | 324/523 |
| 4,619,143 A | * 10/1986 | Franken ........................ | 73/598 |
| 4,630,228 A | 12/1986 | Tarczy-Hornoch et al. ... | 702/59 |
| 4,695,788 A | * 9/1987 | Marshall ...................... | 324/527 |
| 4,734,637 A | * 3/1988 | Chen et al. .................. | 324/642 |
| H924 H | * 6/1991 | Chimenti ...................... | 73/644 |
| 5,068,614 A | 11/1991 | Fields et al. ................. | 324/534 |
| 5,461,329 A | * 10/1995 | Linehan et al. ............. | 324/772 |
| 5,977,773 A | * 10/1999 | Medelius et al. ........... | 324/520 |

FOREIGN PATENT DOCUMENTS

| | | |
|---|---|---|
| DE | 4434915 C1 | 1/1996 |
| EP | 0524837 A1 | 1/1993 |
| EP | 0859237 A1 | 8/1998 |

OTHER PUBLICATIONS

"Standing Wave Differential" IEEE Transactions on Industry Applications, Aug. 1973, pp. 386–387.

* cited by examiner

Primary Examiner—Glenn W. Brown
Assistant Examiner—Wasseem H. Hamdan
(74) Attorney, Agent, or Firm—Perman & Green, LLP

(57) ABSTRACT

A method and a communications device are described, comprising a radio telephone (5) with connected antenna path (1) which can be used to locate precisely a defective area (F) in the antenna path (1) in order to be able to repair the antenna path (1) in a selective fashion. For this purpose, initially a wave with a starting frequency (f0) is coupled into the antenna path (1), and the amplitude of the standing wave at an angular position is measured. Then, the frequency of the wave is increased until a corresponding amplitude is detected at the same angular position. From the frequencies present then and from a reading (n) which indicates how often the corresponding amplitude has been obtained, the fault interval (Ed) between the detector (18) and defective area (F) is then calculated.

13 Claims, 4 Drawing Sheets

FAULT ISOLATION OF AN ANTENNA PATH FOR A RADIO TELEPHONE

FIELD OF THE INVENTION

Brief Description of Related Developments

The present invention relates to antenna systems in communication devices, and in particular to fault isolation in antenna systems.

Nowadays radio telephones are being increasingly installed in motor vehicles, either retrofitted by the customer himself or already fitted when the vehicles are produced, which vehicles can be, for example, motor vehicles or any other vehicles with radio communications devices, for example ships, aircraft, trains, etc. Thus, it is possible, for example, to install two antenna paths for GSM (Global System for Mobile Communications) antennas which can operate as normal antennas or emergency antennas. When the antennas are installed, or during later operation of the vehicles, there is, however, the risk of the respective coaxial lines, the plugs or the antennas themselves being damaged. Satisfactory communication by means of these antennas is then possible only with difficulty, or no longer possible at all. Corresponding problems may also occur in antenna branches of Global Positioning Systems (GPS).

DE 44 34 915 C1 has already disclosed a method and an arrangement for determining the incorrect matching of a load connected to a signal source, in particular of an antenna connected to a transmitter. In the known method, a power which is to be radiated is fed into the antenna branch, a power which is reflected in the antenna branch (by extraction of a portion of the power) is sensed and the extracted portions of the fed-in power and the reflected power are fed to an evaluation means. For this purpose, the two powers are compared in order to obtain the quality signal which indicates the quality level of the antenna branch.

It is thus possible to determine whether or not an antenna branch is defective. If it is, it must be replaced, which is relatively time-consuming and cost-intensive.

The invention is based on the object of specifying a method and a communications device which can be used to determine the position of a defective area in the antenna branch relatively precisely.

SUMMARY OF THE INVENTION

A method according to the invention for determining the position of a defective area which is present in an electrical line path and has signal-reflecting properties comprises the following steps: a signal which has a starting frequency is coupled into the line path or antenna path; the amplitude of a standing wave is measured in absolute terms at a fixed angular position of the oscillation by means of a detector, the standing wave being generated between the defective area and the detector as a result of reflection of the coupled-in signal at the defective area; the frequency of the coupled-in signal is changed in one direction until, after at least just 180° the detector detects again at the aforesaid angular position a corresponding amplitude absolute value of the standing wave which is being formed; and a reading which indicates how often the detector has detected this amplitude absolute value is used, together with the respectively associated frequency and the starting frequency, to determine a fault interval between the detector and defective area.

In this context, the fault interval Ed can preferably be determined by means of the following equation:

$$Ed = X(c/fo)$$

Where $$X = n/2 \times 1/[(fn/fo)-1]$$

Here, Ed is the fault interval, n is the reading having the values 1, 2, 3 etc., f0 is the starting frequency, fn with the values n=1, 2, 3, etc. the frequency of the coupled-in signal for the reading n=1, 2, 3, etc., and c is the propagation velocity of the signal in the line path. Here, c is preferably calculated by means of the expression $$c = \frac{1}{\sqrt{\mu 0 \varepsilon 0 \varepsilon r}}$$

Here, $\mu 0$ is the permeability constant, $\in 0$ is the dielectric constant and $\varepsilon r$ is the relative dielectric constant of the line path.

Since the attenuation of the waves propagating along the line path depends on the frequency, according to one advantageous development of the invention standardized amplitude absolute values are measured by the detector. In order to form the standardized amplitude absolute values, the amplitudes of the radiated-in and reflected waves are compared with another, that is to say standing wave ratios are formed.

In principle, it is possible to acquire the respective amplitude absolute values at any angular position of the full oscillation, that is to say over the range $2\pi$ or 360°. Thus, for example, the amplitude absolute values can be measured in the region of the minima of the standing wave or in the region of the maxima of the standing wave. This makes measurement of the respective amplitude absolute values considerably easier. This also makes the circuitry design simpler.

The frequency of the coupled-in signal is preferably changed continuously starting from the starting frequency, as a result of which the position of defective areas along the line path can be determined even more precisely. However, frequency jumps could also be carried out, but these must not be too large. In the process, the frequency of the coupled-in signal can, depending on requirements, either be increased or decreased starting from the initial frequency.

If an antenna path of a radio telephone is used as the line path, the frequencies used are preferably those on which the radio telephone can transmit. The frequencies may be those of the GSM band. A separate test device for testing the antenna path can thus be dispensed with.

The method itself can, for example, be carried out after the antenna path has been installed in a vehicle or motor vehicle using the radio telephone as a transmitter, that is to say in the last fabrication step of the communications device. However, it is also possible to carry out the method periodically or whenever the radio telephone is put into service, in order to ensure that the communications device has ready status even over a relatively long time period.

A communications device according to the invention is composed of an antenna path installed in a vehicle, and a radio telephone which can be connected to the antenna path. The radio telephone contains the following: a transmitter for coupling a signal having a starting frequency into the antenna path; a detector for measuring in absolute terms the amplitude of a standing wave at a fixed angular position, the standing wave being formed between the detector and a defective area present in the line path; a control device such as for example a programmable microprocessor 10, for changing the frequency of the coupled-in signal in one direction until after at least 180° the detector detects again at the aforesaid angular position a corresponding amplitude absolute value of the standing wave which is formed; a counter within the control device 10 which counts how often the detector has detected this amplitude value; and a computing device for calculating the interval between the defective area and the detector by reference to the starting frequency, to a reading of the counter and to the frequency associated with the respective reading, of the coupled-in signal.

BRIEF DESCRIPTION OF THE DRAWINGS

Exemplary embodiments of the invention are described in detail below with reference to the drawing, in which.

The principles of the method according to the invention will firstly be explained below with reference to FIG. 1.

Figure 1:
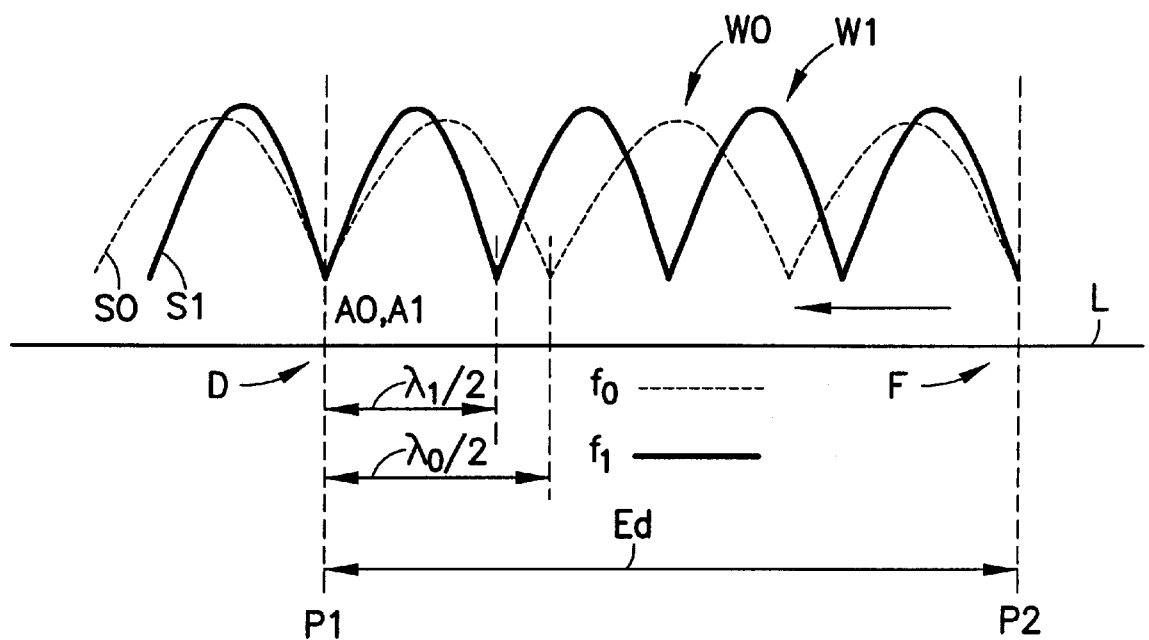
FIG. 1 shows a signal diagram explaining the principles on which the method according to the invention is based.

FIG. 1 shows, as a continuous horizontal line, a line path L which has at a position P2 a defective area F which has signal-reflecting properties. The defective area F may be a line break, a short-circuit etc. Furthermore, in the line path L at a position P1 there is a detector D which is located at an interval Ed from the defective area F. This detector D is capable of measuring the amplitude of a wave, or its absolute value, which propagates along the line path L.

DETAILED DESCRIPTION OF THE PREFERRED EMBODIMENT(S)

Firstly, it will be assumed that a first signal S0 with a starting frequency f0 is fed into the line path L from the left in FIG. 1 by means of a transmitter (not illustrated). This signal S0 is reflected at the defective area F, with the result that a standing wave W0 is formed. The interval Ed happens to have been selected here such that the detector D is positioned at the minimum value of the standing wave W0. For this reason it measures a minimum amplitude absolute value A0. This amplitude absolute value A0 is firstly buffered.

The frequency of the coupled-in signal is then changed, specifically continuously increased until the detector detects the next minimum value which is forming for the wave W1 present now between P1 and P2, of the coupled-in signal S1. In other words, the detector D now measures the amplitude A1.

Both amplitudes A0 and A1 are related to the respective standing waves W0, W1 at the same angular positions of the respective oscillations (for example 0° here).

If it is borne in mind that, in the first instance, there must be in each case a minimum value of the standing waves W0, W1 at the defective area F, and, in the second incidence, in each case a minimum value is also measured at the location of the detector, with this specific case there must be integral multiples of the half wavelength of the respective standing waves W0 and W1 at the interval Ed. This can be expressed by means of the following equation (1):

$$X \cdot \lambda 0 = \left(X + \frac{n}{2}\right) \cdot \lambda 1 \tag{1}$$

Here, $\lambda 0$ and $\lambda 1$ are respectively the wavelengths of the signals S0 and S1 with the frequencies f0 and f1, and a counter 42 in control device 10 displays a reading n which indicates how many times the detector D has again detected a minimum amplitude absolute value starting from the starting frequency f0 (in the present case n=1), and X is a dimensioning value. If the above equation (1) is solved according to X and if the respective frequency of the signals is inserted instead of the wavelength, the equation (2) is obtained:

$$X = \frac{n}{2} \frac{1}{\left(\frac{fn}{f0} - 1\right)} \tag{2}$$

In the present case, n=1, so that the value f1 is to be inserted for fn in equation (2).

Using equation (2), the interval Ed is then obtained according to the following equation (3):

$$Ed = X \cdot \frac{c}{f0} \tag{3}$$

Here, c is the propagation velocity of the signal coupled into the line path L and it is determined essentially by the following equation (4):

$$c = \frac{1}{\sqrt{\mu 0 \varepsilon 0 \varepsilon r}} \tag{4}$$

Here, $\mu 0$ is the permeability constant, $\varepsilon 0$ is the dielectric constant of the vacuum and $\varepsilon r$ is the relative dielectric constant of the line path L.

If, in the above example according to FIG. 1, the frequency were to be increased even further to a value f2 at which the detector D measures for the second time a minimum amplitude value of the standing wave which is then formed, that is to say A2, the value 2 would have to be inserted in the above equation (3) or the expression n, etc.

The following table is given as an example.

TABLE

| | | |
|---|---|---|
| Starting frequency f0 = 890 MHz | X = 17.8 | Ed = 5.99 m |
| Stopping frequency f1 = 915 MHz | X = 18.3 | Ed = 5.99 m |
| Stopping frequency f2 = 940 MHz | X = 18.8 | Ed = 5.99 m |
| Stopping frequency f3 = 965 MHz | X = 19.3 | Ed = 5.99 m |

Here, using the starting frequency f0 and the first stopping frequency f1 a value X=18.3 is obtained, which gives a fault interval Ed of 5.99 m. When the starting frequency f0 and the second stopping frequency F2 are used, a value X of 18.8 is obtained, which gives, however, the same fault interval Ed of 5.99 m. In this respect it is to be noted that the factor $1/\sqrt{\mu 0 \varepsilon 0 \varepsilon r}$ has not yet been taken into account, because the material constants of the line path L have not been inserted. Changes to the frequency to the extent described above do not, however, lead to any significant changes in the above intervals with respect to one another so that in all cases it is possible to determine areas in which a fault in the line path L is present. If the material constants of the line path L are taken into account, the above fault intervals Ed are then correspondingly smaller.

Figure 2:
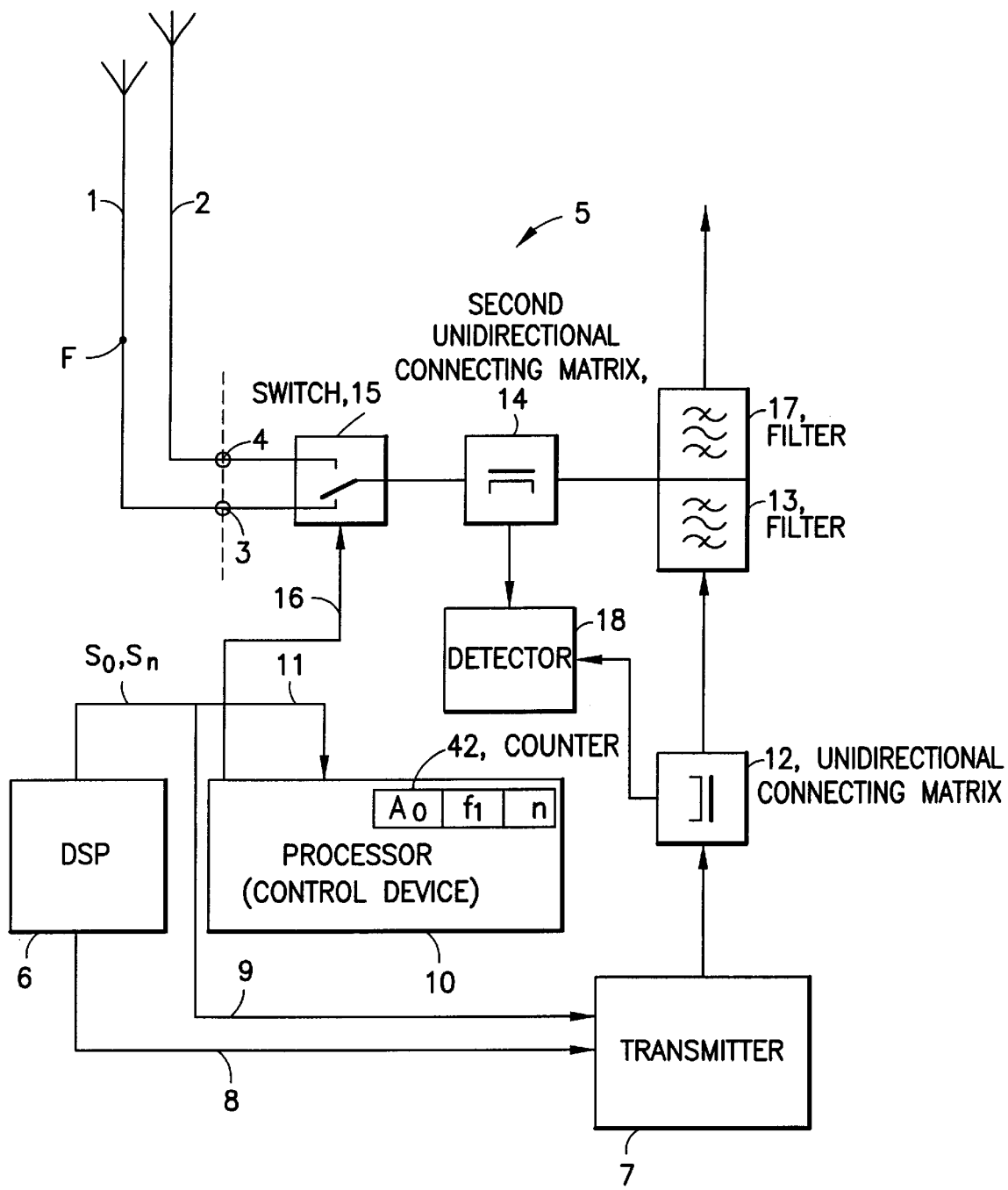
FIG. 2 shows a block circuit diagram of a first exemplary embodiment of a communications device according to the invention.

FIG. 2 shows a first exemplary embodiment of a communications device which operates according to the method in accordance with the invention.

The communications device, which can be installed, for example in a motor vehicle, contains two antenna paths 1 and 2 which are installed in the motor vehicle and which can each be connected by means of terminals 3 and 4 to corresponding outputs of a radio telephone 5, which may, for example, be a portable radio telephone or mobile phone which can be inserted into a corresponding receptacle installed in the motor vehicle. One of the antenna paths 1 can be used here during the normal operation of the radio telephone 5, while the other antenna path 2 is connected, for example, to an emergency antenna. One of the antenna paths 1, 2 can be selected depending on the respective situation.

The digital radio telephone 5 itself has a digital signal processor (DSP) 6 whose circuits are hard-wired so that it cannot be programmed. This makes it relatively quick and it can therefore be used for operations for which timing is critical. One of these operations is, for example the combination of the bursts which are to be transmitted. In a TDMA method such as GSM, the voice data are input continuously here from a microphone/voice coder of the radio telephone 5, and the digital signal processor 6 combines the digital data packets which have to be dispatched in the predetermined time slots by a transmitter 7 which is connected to the output end. The digital signal processor 6 therefore transmits the data via a data line 8 to the transmitter 7 at a transmission time and simultaneously transmits a control signal via a line 9 to the transmitter 7 in order to switch it on at the transmission time.

The same control signal, which is supplied by the digital signal processor 6 to the transmitter 7 via the line 9, also receives a microprocessor 10 via a line 11. The microprocessor 10 thus also knows when data are output via the transmitter 7. In addition, via the lines 9 and 11, the digital signal processor 6 tells the transmitter 7 and the microprocessor 10 which transmission frequency is being used.

During normal operation, the transmitter frequency which the radio telephone is to use is communicated by the base station in a message. The microprocessor 10 receives this message by evaluating the bursts received from the base station.

The signals transmitted by the transmitter 7 at the output end are fed via a unidirectional test equipment connecting matrix 12 to a TX antenna filter 13 and further via a second unidirectional test equipment connecting matrix 14 to an input of an antenna switch 15. Depending on the position of the antenna switch 15, the signals which are output by the transmitter 7 are then coupled into the antenna path 1 or into the antenna path 2. A control signal for selecting the switched position of the antenna switch 15 is supplied to the antenna switch 15 as a function of the predefined conditions by the microprocessor 10 via a control line 16.

Signals received via one of the antenna paths 1 or 2 are directed to an RX filter 17 via the antenna switch 15 and the unidirectional test equipment connecting matrix 14 and are fed via this filter into the receive circuit of the radio telephone 5. This will not be explained more precisely below. In this context, we will simply mention that in the GSM system the base station transmits to the mobile stations at a frequency of 935 to 960 MHz while the mobile stations transmit to the base station at a frequency of 890 to 915 MHz. In order to ensure that the receiver of the mobile station only receives signals from the base station, and in order to prevent power emitted by the mobile station from being transmitted into its own receiver, the RX filter 17 or bandpass filter which only allows frequencies of 935 to 960 MHz to pass is provided. On the other hand, the TX filter 13 correspondingly only allows frequencies in the region from 890 to 915 MHz to pass. The filters could theoretically also be replaced by a switch which, controlled by the microprocessor 10, switches over constantly between transmit mode and receive mode.

The test equipment connecting matrix 12 whose design is generally known extracts part of the wave which is to be output and is emitted by the transmitter 7 and supplies this part to a detector 18 which detects the amplitude of the extracted wave. On the other hand the unidirectional test equipment connecting matrix 14 is capable of also extracting signals reflected at defective areas in the antenna paths 1 or 2 and transmitting them to the detector 18. The detector 18 also measures the amplitude of these signals and is thus capable of forming a standing wave ratio between the originally emitted wave and the wave reflected at a defective area. This standing wave ratio is formed continuously over the entire wavelength of the oscillation. Because the microprocessor 10 is informed of the frequency of the emitted wave by the digital processor 6, the microprocessor 10 can assign the standing wave ratio which is formed for that angular position a within a period to the emitted wave at which measurement is currently being carried out.

In other words, the microprocessor 10 is capable of specifying the standing wave ratio, for example, at the minimum value of the standing wave, at the maximum value of the standing wave or at any other desired angular position α.

If the communications device according to the invention is intended to be used to determine whether there are faults in the antenna paths 1 and 2 and to determine at what position these faults are located, the communications device is initially switched over into a test operating mode. This can be carried out directly after installation of the communications device in a vehicle or before each time it is put into service or after each time the device is directly switched on.

If it is assumed that the antenna switch 15 connects the antenna path 1 to the radio telephone 5, and if there is a defective area at which reflections occur in the antenna path 1, initially the signal S0 which has already previously been mentioned is coupled into the antenna path 1 by means of the transmitter 7 and is reflected at the defective area in said antenna path 1. The frequency f0 of the signal S0 can be selected here such that the detector 18 measures the standing wave ratio at the minimum value of the standing wave W0 which is formed, as shown in FIG. 1. This standing wave ratio is buffered in the form of amplitude A0 in absolute terms in the microprocessor 10.

The frequency of the wave which is emitted by the transmitter 7 is now continuously increased. The detector 18 constantly measures the standing wave ratio of the wave which changes in terms of frequency and determines if a standing wave ratio which corresponds to the previously determined standing wave ratio appears. If this case occurs, the associated higher frequency of the signal which is emitted by the transmitter 7 is stored in the microprocessor 10. The microprocessor 10 also counts, as a function of the output signal of the detector 18, how often the corresponding standing wave ratio is received when the frequency of the signal emitted by the transmitter 7 increases. It is in principle sufficient to increase the frequency of the starting signal until a standing wave ratio which corresponds to the original standing wave ratio is obtained again for the first time. In this case, the reading of the counter n=1.

The fault interval Ed between the detector and defective area F is then calculated according to equation (2) and (3) using the frequency f0 of the starting signal, which is also buffered in the microprocessor 10, the frequency f1 and the reading n=1. If the material constant of the antenna path is also taken into account with equation (4), a relatively precise fault interval is obtained and the antenna path can then be repaired in a selective fashion.

Figure 3:
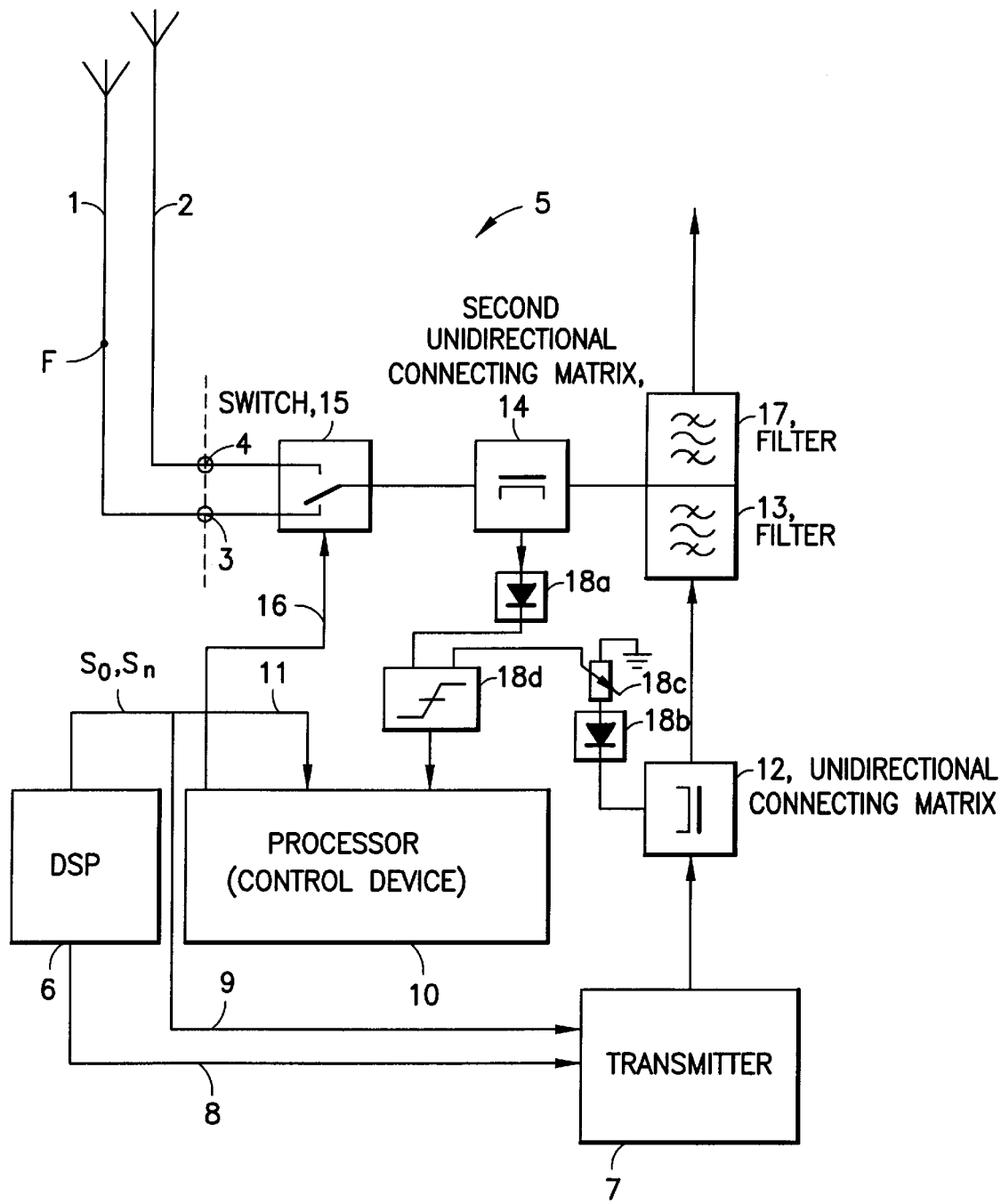
FIG. 3 shows a block circuit diagram of a second exemplary embodiment of the communications device according to the invention.

FIG. 3 shows a second exemplary embodiment of the communications device according to the invention. The device is an analogue type here. The voltage which is supplied to a threshold value 18d can be set by means of an adjustable resistor 18c. This is as a rule performed during the adjustment of the radio telephone after production. If necessary, it can also be re-adjusted when the radio telephone is being serviced. The threshold value switch 18d in the form of a quotient building stage is used to form the standing wave ratio, as already mentioned at the beginning. It can be used to determine whether there is a defect in the antenna path so that it can detect the maxima of the return wave or reflected wave. As soon as a maximum value is detected at a frequency at the unidirectional test equipment connecting matrix 14, the threshold value switch 18d transmits a positive signal to the microprocessor 10a, and at all the values lying below that it transmits a negative signal. Of course, here too, the frequency f0, the frequency fn and the reading n are also stored again in the microprocessor 10a. The fault interval Ed is then in turn calculated in accordance with the equations (2) and (3) or (4). Instead of measuring at the maximum value, it would also be possible to measure at another location, for which purpose the threshold value or a threshold value range would have to be appropriately set.

In the exemplary embodiment according to FIG. 3, diode rectifiers are also referred to with the reference symbols 18a and 18b. They rectify the signals, extracted from the unidirectional measured value connecting matrices 12 and 14, of the emitted and reflected wave. The forward or emitted signal which is extracted from the measured value connecting matrix 12 is thus fed via the diode rectifier 18b and the resistor 18c to an input of the threshold value switch 18d (reference input), while the signal which is extracted from the test equipment connecting matrix 14 is fed via the diode rectifier 18a to another input of the threshold value switch 18d.

Figure 4:
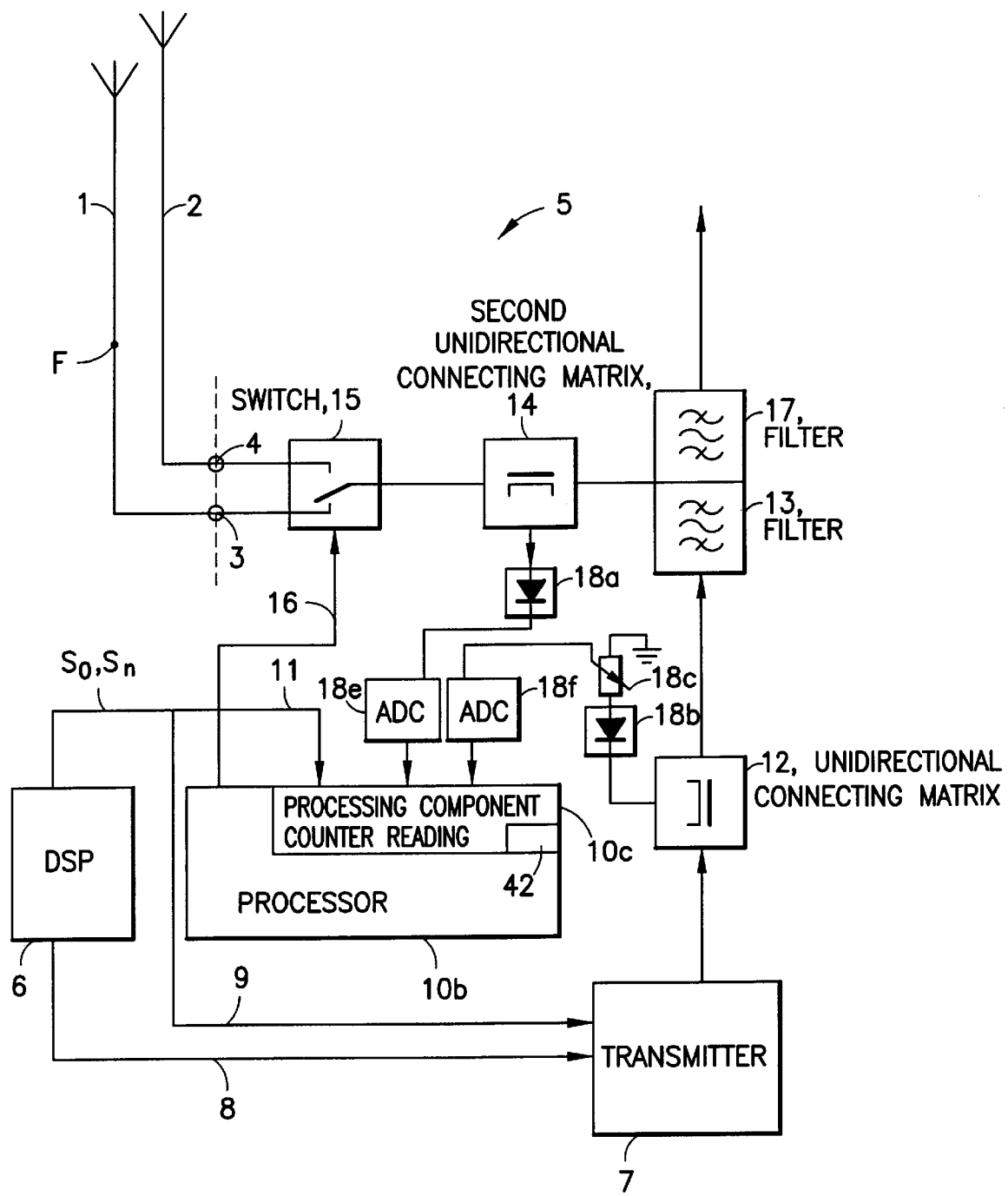
FIG. 4 shows a block circuit diagram of a third exemplary embodiment of the communications device according to the invention.

FIG. 4 shows yet another exemplary embodiment of a communication device according to the invention. Identical elements to those in FIG. 2 are in turn provided with the same reference symbols and are not described again. It is a digital type here. Here too, the diode rectifiers 18a and 18b and the adjustable resistor 18c are present, as already described with reference to FIG. 3. In contrast to the analogue type, the voltages supplied by the rectifiers of the forward and return waves are, however, fed immediately to analogue/digital converters 18e and 18f in order to be converted into digital signals. The microprocessor 10b can now use the incoming data to carry out calculations according to the equations (2), (3) and (4) in order to locate the defective area F. For this purpose, the microprocessor 10b has a processing component 10c in which the standing wave rations are initially formed and are buffered together with the frequencies f0 and fn as well as the counter 42 reading n.

The adjustment which is carried out by the adjustable resistor 18c could also be carried out electronically by the microprocessor 10b.

What is claimed is:

1. Method for determining the position of a defective area (F) which is present in an electrical line path (L) and has signal-reflecting properties, having the following steps:

a signal (S0) which has a starting frequency (f0) is coupled into the line path (L);

the amplitude (A0) of a standing wave (W0) is measured in absolute terms at a fixed angular position (2) by means of a detector (D), the standing wave (W0) being generated between the defective area (F) and the detector (D) as a result of reflection of the coupled-in signal (S0) at the defective area (F);

the frequency of the coupled-in signal is changed in one direction until, after at least just 180° the detector (D) detects again at the aforesaid angular position ($\alpha$) a corresponding amplitude absolute value (A1) of the standing wave (W1) which is being formed; and a reading n, which indicates how often the detector (D) has detected this amplitude absolute value (A1), is used, together with the respectively associated frequency (fn) and the starting frequency (f0), to determine a fault interval (Ed) between the detector (D) and defective area (F).

2. The method according to claim 1, characterized in that the fault interval (Ed) is determined by means of the following equation:

$$Ed = X \cdot \frac{c}{f0}$$

where $$X = \frac{n}{2} \frac{1}{\left(\frac{fn}{f0} - 1\right)} \quad \text{and} \quad c = \frac{1}{\sqrt{\mu 0 \varepsilon 0 \varepsilon r}}$$

in which for the reading n=1, 2, 3, . . . , f0 is the starting frequency, fn where n=1, 2, 3, . . . is the frequency of the coupled-in signal for the reading n=1, 2, 3, . . . , c is the propagation velocity of the signal in the line path, $\mu 0$ is the permeability constant, $\in 0$ is the dielectric constant and $\in r$ is the relative dielectric constant of the line path.

3. Method according to claim 1, characterized in that the detector (D) measures standardized amplitude absolute values.

4. Method according to claim 1, characterized in that the detector (D) measures the amplitude absolute values in the region of the minima of the standing wave.

5. Method according to claim 1, characterized in that the detector (D) measures the amplitude absolute values in the region of the maxima of the standing wave.

6. Method according to claim 1, characterized in that the frequency of the coupled-in signal is changed continuously starting from the starting frequency (f0).

7. Method according to claim 1, characterized in that the frequency of the coupled-in signal is increased starting from the starting frequency (f0).

8. Method according to claim 1, characterized in that an antenna path of a radio telephone is used as line path (L).

9. Method according to claim 8, characterized in that it is carried out after installation of the antenna path in a motor vehicle using the radio telephone as a transmitter.

10. Method according to claim 9, characterized in that it is carried out periodically or whenever the radio telephone is put into service.

11. Method according to claim 8, characterized in that the frequencies (f0, fn) used are those on which the radio telephone can transmit.

12. Method according to claim 1, characterized in that all the frequencies (F0, fn) lie in the GSM band.

13. Communications device having an antenna path which is installed in a vehicle, and a radio telephone which can be connected to the antenna path, the radio telephone containing the following:

a transmitter for coupling a signal (S0) having a starting frequency (f0) into the antenna path;

a detector adapted to receive a part of a standing wave (W0) from the transmitter for measuring in absolute terms the amplitude (A0) of the standing wave (W0) at a fixed angular position ($\alpha$), the standing wave (W0) being formed between the detector and a defective area (F) present in the antenna path;

a control device coupled to an output of the detector for changing the frequency of the coupled-in signal in one direction until after at least 180° the detector detects again at the aforesaid angular position ($\alpha$) a corresponding amplitude absolute value (A1) of the standing wave (W1) which is formed;

a counter in the control device which counts how often the detector has detected this amplitude absolute value (A1); and a computing device in the control device for calculating the interval (Ed) between the defective area (F) and the detector by reference to the starting frequency (f0), to a reading (n) of the counter and to the frequency (fn), associated with the respective reading (n), of the coupled-in signal.

\* \* \* \* \*